United States Patent
Kim et al.

(10) Patent No.: US 8,550,667 B2
(45) Date of Patent: Oct. 8, 2013

(54) OPTICAL FILM AND ORGANIC LIGHT EMITTING DISPLAY APPARATUS INCLUDING THE SAME

(75) Inventors: Tae-Kyu Kim, Yongin (KR); Soon-Ryong Park, Yongin (KR); Chul-Woo Jeong, Yongin (KR); Hee-Seong Jeong, Yongin (KR); Woo-Suk Jung, Yongin (KR); Il-Ryong Cho, Yongin (KR); Sung-Soo Koh, Yongin (KR); Jae-Yong Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 436 days.

(21) Appl. No.: 12/985,944

(22) Filed: Jan. 6, 2011

(65) Prior Publication Data

US 2011/0176304 A1 Jul. 21, 2011

(30) Foreign Application Priority Data

Jan. 19, 2010 (KR) .......................... 10-2011-0004753

(51) Int. Cl.
*F21V 3/00* (2006.01)
*F21V 5/00* (2006.01)

(52) U.S. Cl.
USPC .......... 362/311.02; 362/84; 362/800; 257/98; 313/506

(58) Field of Classification Search
USPC ............... 257/98; 313/504, 506, 512; 362/84, 362/311.02, 545, 800
See application file for complete search history.

(56) References Cited

U.S. PATENT DOCUMENTS

| | | |
|---|---|---|
| 6,384,970 B1 | 5/2002 | Abe et al. |
| 7,057,209 B2 | 6/2006 | Yamazaki et al. |
| 7,400,088 B2 | 7/2008 | Ryu |
| 7,420,210 B2 | 9/2008 | Yamazaki et al. |
| 7,470,933 B2 | 12/2008 | Lee et al. |
| 7,667,388 B2 | 2/2010 | Ryu |
| 2003/0067266 A1 | 4/2003 | Kim et al. |

(Continued)

FOREIGN PATENT DOCUMENTS

| | | |
|---|---|---|
| JP | 06-265870 | 9/1994 |
| JP | 2000-147668 | 5/2000 |

(Continued)

OTHER PUBLICATIONS

Korean Registration Determination Certificate issued on May 15, 2012 in the corresponding Korean patent application No. 10-2010-0004753.

(Continued)

*Primary Examiner* — Stephen F Husar
(74) *Attorney, Agent, or Firm* — Robert E. Bushnell, Esq.

(57) ABSTRACT

An optical film capable of preventing reflection of external light, and an organic light emitting display (OLED) apparatus including the same, are disclosed. The optical film is disposed on a substrate of an organic light emitting display, and comprises a first substrate, a first electrode, a light emitting unit comprising a plurality of organic light emitting elements, and a second electrode sequentially formed on the first substrate. The second substrate concentrates light emitted from the light emitting unit so as to emit outward, and absorbs external light so as to prevent the external light from being reflected.

14 Claims, 3 Drawing Sheets

(56) References Cited

U.S. PATENT DOCUMENTS

| | | |
|---|---|---|
| 2004/0206960 A1 | 10/2004 | Nishikawa |
| 2005/0140879 A1 | 6/2005 | Nam |
| 2005/0270761 A1 | 12/2005 | Kung et al. |
| 2005/0270763 A1 | 12/2005 | Koike et al. |
| 2005/0270766 A1 | 12/2005 | Kung et al. |
| 2006/0068128 A1 | 3/2006 | Greener et al. |
| 2006/0244877 A1 | 11/2006 | Noh et al. |
| 2006/0256254 A1 | 11/2006 | Park et al. |
| 2006/0286395 A1 | 12/2006 | Goto et al. |
| 2007/0108900 A1* | 5/2007 | Boek et al. ............ 313/506 |
| 2007/0235320 A1 | 10/2007 | White et al. |
| 2007/0241664 A1 | 10/2007 | Sakamoto et al. |
| 2008/0054787 A1 | 3/2008 | Hwang et al. |
| 2008/0225530 A1 | 9/2008 | Joo et al. |
| 2009/0015142 A1 | 1/2009 | Potts et al. |
| 2009/0015757 A1 | 1/2009 | Potts et al. |
| 2009/0154157 A1 | 6/2009 | Sah |
| 2009/0202819 A1 | 8/2009 | Asahi et al. |
| 2010/0110551 A1 | 5/2010 | Lamansky et al. |

FOREIGN PATENT DOCUMENTS

| | | |
|---|---|---|
| JP | 2004127662 | 4/2004 |
| JP | 2004-303481 A | 10/2004 |
| JP | 2005-347081 A | 12/2005 |
| KR | 10-2003-0030351 A | 4/2003 |
| KR | 10-2005-0068194 A | 7/2005 |
| KR | 1020080049295 | 6/2008 |
| KR | 10-2009-0022171 A | 3/2009 |
| KR | 10-2009-0026067 A | 3/2009 |
| KR | 10-2009-0026125 A | 3/2009 |

OTHER PUBLICATIONS

Korean Office Action issued on Jan. 27, 2012 in connection with Korean Patent Application Serial No. 10-2010-0004753 and Request for Entry of the Accompanying Office Action attached herewith.

\* cited by examiner under 35 U.S.C. §119# OPTICAL FILM AND ORGANIC LIGHT EMITTING DISPLAY APPARATUS INCLUDING THE SAME

CLAIM OF PRIORITY

This application makes reference to, incorporates the same herein, and claims all benefits accruing under 35 U.S.C. §119 from an application earlier filed in the Korean Intellectual Property Office on the 19 Jan. 2010 and there duly assigned Serial No. 10-2010-0004753.

BACKGROUND OF THE INVENTION

1. Field of the Invention

The present invention relates to an optical film capable of preventing reflection of external light, and an organic light emitting display (OLED) apparatus including the same.

2. Description of the Related Art

In general, flat display devices may be classified into an emissive type and a non-emissive type. The emissive type includes a flat cathode ray tube, a plasma display panel (PDP), an electro luminescent device, a light emitting diode (LED), and the like. The non-emissive type includes a liquid crystal display (LCD) device. From among them, the electro luminescent device has a wide viewing angle, an excellent contrast and a fast response speed, and thus is regarded as a representative next-generation display device. Electro luminescent devices are classified into an inorganic electro luminescent device and an organic electro luminescent device according to a material for forming an emission layer (EML).

An organic electro luminescent device is a self light emitting display device for emitting light by electrically exciting a florescent organic compound, is capable of realizing low-voltage driving, a thin size, a wide viewing angle, a fast response speed and the like which are not enabled in an LCD device, and thus is regarded as a next-generation display device.

An organic electro luminescent device includes an EML formed of an organic material between an anode electrode and a cathode electrode. In the organic electro luminescent device, as plus and minus voltages are applied to the anode and cathode electrodes, holes injected from the anode electrode move to the EML via a hole transport layer (HTL), electrons move from the cathode electrode to the EML via an electron transport layer (ETL), and the electrons and the holes are recombined in the EML so as to generate exitons.

As the exitons change from an excited state to a ground state, fluorescent molecules in the EML emit light so as to form an image. A full color organic electro luminescent device realizes full colors by including pixels for emitting red (R), green (G) and blue (B) light.

In the organic electro luminescent device, a pixel define layer is formed at two ends of the anode electrode. Then, an opening is formed in the pixel define layer, and the EML and the cathode electrode are sequentially formed on the anode electrode exposed due to the opening.

SUMMARY OF THE INVENTION

One or more embodiments of the present invention include an optical film capable of preventing reflection of external light, and an organic light emitting display (OLED) apparatus including the same.

Additional aspects will be set forth, in part, in the description which follows and, in part, will be apparent from the description, or may be learned by practice of the presented embodiments.

According to one or more embodiments of the present invention, an optical film is disposed on a second substrate of an organic light emitting display (OLED) apparatus including: a first substrate; a first electrode, a light emitting unit including a plurality of organic light emitting elements, and a second electrode sequentially formed on the first substrate; and the second substrate concentrates light emitted from the light emitting unit so as to emit the concentrated light outward, and absorbs external light so as to prevent the external light from being reflected.

The optical film may include: a plurality of microstructures; and a light absorption unit disposed between the plurality of microstructures and absorbing external light; wherein the microstructures concentrate light emitted from the OLED apparatus so as to emit the concentrated light outward; and wherein the light absorption unit absorbs light incident from outside of the OLED apparatus so as to prevent the incident light from being reflected.

Each of the plurality of microstructures preferably includes: a first transmission unit disposed on a first surface of the optical film, which faces outward; a second transmission unit disposed on a second surface of the optical film, which is opposite to the first surface; and a reflection unit connecting the first transmission unit and the second transmission unit and forming a side wall of each of the plurality of microstructures, wherein an area of the first transmission unit is smaller than that of the second transmission unit.

Each of the first transmission unit and the second transmission unit may transmit light.

Each of the first surface and the second surface may be a smooth surface.

The reflection unit may reflect light transmitted through the first transmission unit or the second transmission unit and proceeding toward the reflection unit.

The reflection unit may be convex toward the first surface.

The light absorption unit may be disposed between the plurality of microstructures and may be partially exposed on the first surface.

Internal portions of the plurality of microstructures may be formed of a transparent resin material.

A refractive index of the resin material may continuously change in a direction from the first surface toward the second surface.

The refractive index of the resin material may be increased in a direction from the first surface toward the second surface.

A refractive index of the plurality of microstructures may be greater than that of the light absorption unit.

One organic light emitting element may correspond to a plurality of microstructures.

A distance between the plurality of microstructures may be greater than that between the plurality of organic light emitting elements.

The distance between the plurality of microstructures may be about 200 nm to about 250 nm.

According to one or more embodiments of the present invention, an organic light emitting display (OLED) apparatus includes: a first substrate; an organic light emitting unit disposed on the first substrate and comprising a plurality of organic light emitting elements; a second substrate covering the first substrate; and an optical film disposed on the second substrate; wherein the optical film concentrates light emitted from the light emitting unit so as to emit the concentrated light outward and absorbs external light so as to prevent the external light from being reflected.

The optical film may include: a plurality of microstructures; and a light absorption unit disposed between the plurality of microstructures and absorbing external light;

wherein the microstructures concentrate light emitted from the OLED apparatus so as to emit the concentrated light outward; and wherein the light absorption unit absorbs light incident from outside of the OLED apparatus so as to prevent the incident light from being reflected.

Each of the plurality of microstructures may include: a first transmission unit disposed on a first surface of the optical film, which faces outward; a second transmission unit disposed on a second surface of the optical film, which is opposite to the first surface; and a reflection unit connecting the first transmission unit and the second transmission unit and forming a side wall of each of the plurality of microstructures; wherein an area of the first transmission unit is smaller than that of the second transmission unit.

Each of the first transmission unit and the second transmission unit may transmit light.

Each of the first surface and the second surface may be a smooth surface.

The reflection unit may reflect light transmitted through the first transmission unit or the second transmission unit, and proceeding toward the reflection unit.

The reflection unit may be convex toward the first surface.

Internal portions of the plurality of microstructures may be formed of a transparent resin material.

A refractive index of the resin material may continuously change in a direction from the first surface toward the second surface.

The refractive index of the resin material may be increased in a direction from the first surface toward the second surface.

A refractive index of the plurality of microstructures may be greater than that of the light absorption unit.

One organic light emitting element may correspond to a plurality of microstructures.

A distance between the plurality of microstructures may be greater than that between the plurality of organic light emitting elements.

The distance between the plurality of microstructures may be about 200 nm to about 250 nm.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
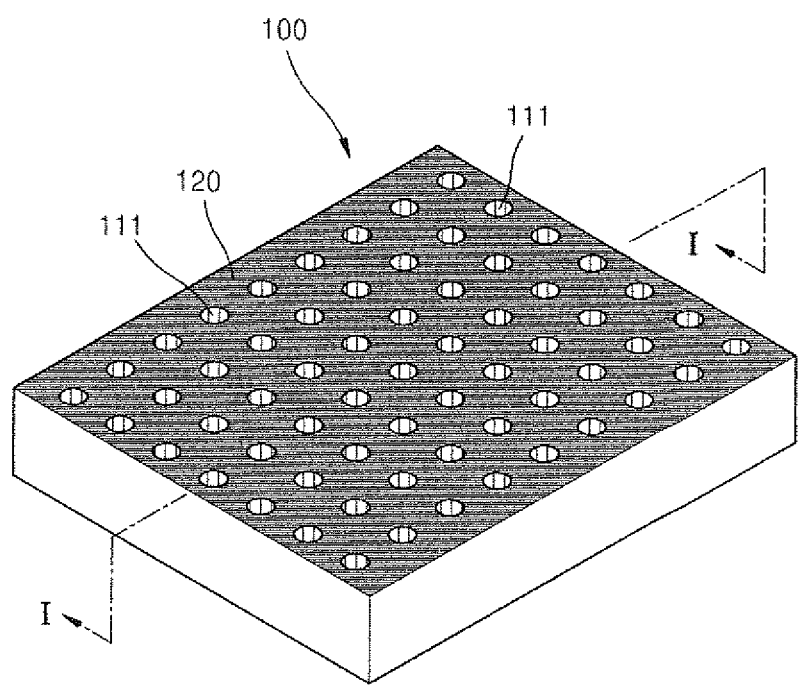
FIG. 1 is a perspective view an optical film according to an embodiment of the present invention.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

Figure 2:
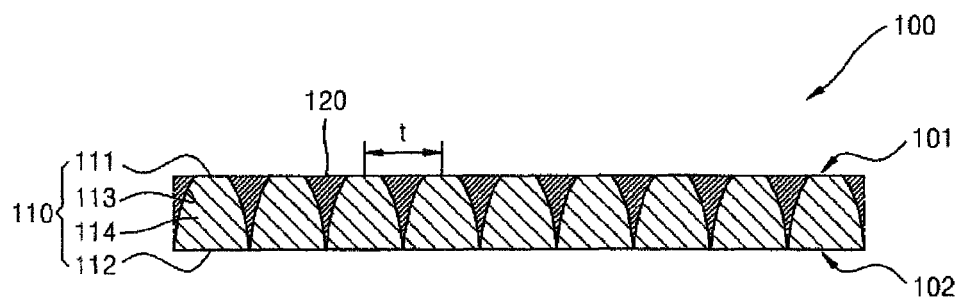
FIG. 2 is a cross-sectional view taken along a line I-I illustrated in FIG. 1.
Figure 3:
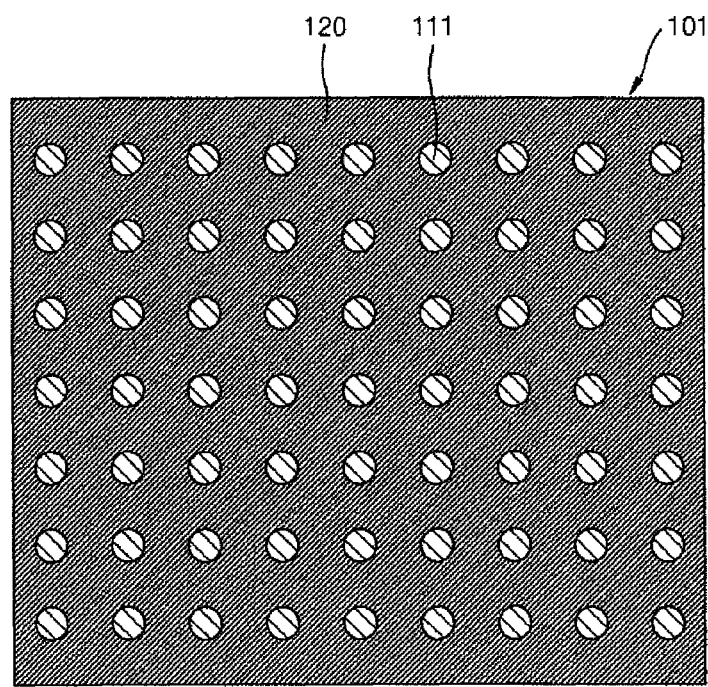
FIG. 3 is a plan view of the optical film illustrated in FIG. 1.

FIG. 1 is a perspective view an optical film according to an embodiment of the present invention, FIG. 2 is a cross-sectional view taken along a line I-I illustrated in FIG. 1, and FIG. 3 is a plan view of the optical film illustrated in FIG. 1.

The optical film 100 is disposed on one surface of an organic light emitting display (OLED) apparatus 200 (see FIG. 5), concentrates light emitted from the OLED apparatus 200 so as to emit the concentrated light to the outside of the OLED apparatus 200, and absorbs light incident on the OLED apparatus 200 from the outside of the OLED apparatus 200 so as to prevent the incident light from being reflected. In order to emit and absorb light, the optical film 100 may include microstructures 110 and a light absorption unit 120. The microstructures 110 may concentrate light emitted from the OLED apparatus 200 so as to emit the concentrated light to the outside of the OLED apparatus 200, and the light absorption unit 120 may absorb light incident on the OLED apparatus 200 from the outside of the OLED apparatus 200 so as to prevent the incident light from being reflected.

Referring to FIGS. 1 thru 3, a microstructure 110 may include a first transmission unit 111, a second transmission unit 112, a reflection unit 113 and a central portion 114.

The first transmission unit 111 and the second transmission unit 112 are disposed on the optical film 100 so as to be opposite to each other. In more detail, the first transmission unit 111 is disposed on a first surface 101 of the optical film 100, which faces outward. The second transmission unit 112 is disposed on a second surface 102 of the optical film 100, which is opposite to the first surface 101. The second surface 102 is opposite to the first surface 101 and faces the OLED apparatus 200. Here, each of the first surface 101 and the second surface 102 may be a smooth surface.

Light is transmitted through the first transmission unit 111 and the second transmission unit 112. In more detail, the first transmission unit 111 is disposed on the first surface 101 and the second transmission unit 112 is disposed on the second surface 102 such that light emitted from the OLED apparatus 200 is transmitted through the second transmission unit 112 and the first transmission unit 111 so as to be emitted outward. Also, external light may pass through the first transmission unit 111 and the second transmission unit 112 so as to be incident on the OLED apparatus 200.

The area of the first transmission unit 111 is smaller than that of the second transmission unit 112. That is, referring to FIG. 3, the light absorption unit 120 exists between the first transmission units 111 on the first surface 101 of the optical film 100. In other words, the light absorption unit 120 is entirely disposed, and then the first transmission units 111 are aligned on the first surface 101. Light is emitted and incident through the first transmission unit 111, and external light is absorbed by the light absorption unit 120. Only the second transmission units 112 are disposed on the second surface 102. Although the light absorption unit 120 may not be disposed on the second surface 102, one or more embodiments of the present invention are not limited thereto and the light absorption unit 120 may be disposed on the second surface 102 such that the area of the second transmission unit 112 is larger than that of the first transmission unit 111.

The reflection unit 113 refers to an interface between each of the microstructures 110 and the light absorption unit 120. Light incident through the first transmission unit 111 or the second transmission unit 112, and proceeding toward the reflection unit 113, is reflected on the reflection unit 113. Light may be repeatedly reflected on the reflection unit 113 so as to be concentrated, which will be described later.

As illustrated in FIG. 2, the reflection unit 113 is convex toward the first surface 101. That is, the reflection unit 113 may form a curved surface from the second transmission unit 112 toward the first transmission unit 111. Accordingly, the horizontal cross-sectional surface of the microstructure 110 may decreases in a direction from the second transmission unit 112 to the first transmission unit 111.

The central portion 114 refers to an internal portion of the microstructure 110 and is surrounded by the first transmission unit 111, the second transmission unit 112, and the reflection unit 113. The central portion 114 may be formed of a transparent resin material. A refractive index continuously changes in the central portion 114. In more detail, the refractive index continuously changes in a vertical direction of the microstructure 110, i.e., a direction from the first surface 101 toward the second surface 102. Preferably, the refractive index of the central portion 114 is increased in the direction from the first surface 101 toward the second surface 102. Also, the refractive index of the microstructure 110 is greater than that of the light absorption unit 120. Since the refractive index of the central portion 114 of the microstructure 110 continuously changes and the refractive index of the microstructure 110 is greater than that of the light absorption unit 120, the microstructure 110 may repeatedly reflect light so as to concentrate the light, which will be described later.

The distance between the microstructures 110 may be smaller than that between organic light emitting elements. As such, a plurality of the microstructures 110 may be aligned so as to correspond to one organic light emitting element. Since the distance between the microstructures 110 is smaller than that between organic light emitting elements, one microstructure 110 does not need to be aligned to correspond to one organic light emitting element. A distance t between the microstructures 110 may be about 200 nm to about 250 nm.

The light absorption unit 120 is disposed between the microstructures 110, and is partially exposed on the first surface 101 of the optical film 100. However, the light absorption unit 120 may not be exposed or may be less exposed on the second surface 102 than on the first surface 101. As such, the area of the second transmission unit 112 is larger than that of the first transmission unit 111. The light absorption unit 120 may absorb light incident on the light absorption unit 120. That is, the light absorption unit 120 exposed on the first surface 101 absorbs light incident on the OLED apparatus 200 from the outside of the OLED apparatus 200, and thus prevents the light from being reflected outward. The light absorption unit 120 may be formed of a light-absorbing material. For example, the light absorption unit 120 may be formed of a black carbon material. However, one or more embodiments of the present invention are not limited thereto, and the light absorption unit 120 may be formed of various color light-absorbing materials.

Figure 4:
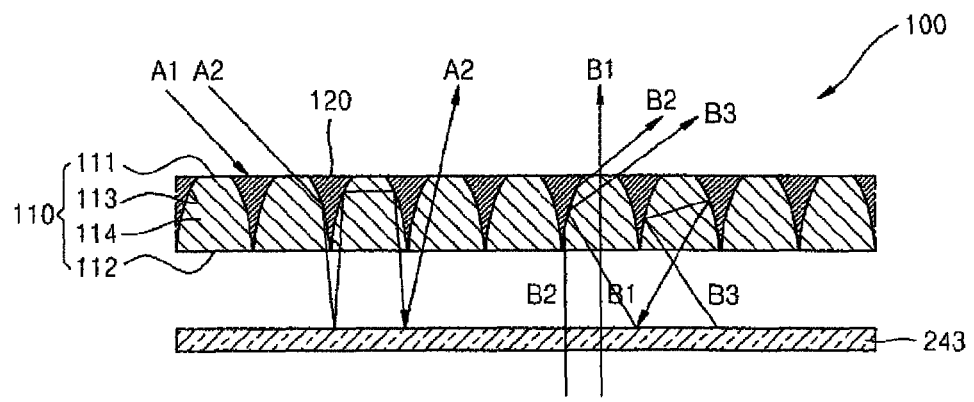
FIG. 4 is a cross-sectional view for describing functions of the optical film illustrated in FIG. 1.

FIG. 4 is a cross-sectional view for describing functions of the optical film 100 illustrated in FIG. 1.

Referring to FIG. 4, from among light proceeding toward the optical film 100 from the outside of the optical film 100, light A1 incident toward the light absorption unit 120 is absorbed by the light absorption unit 120 and is not reflected outward, and light A2 incident toward the first transmission unit 111 is transmitted through the first transmission unit 111 and is incident on the central portion 114 of the microstructure 110. The light A2 incident on the central portion 114 of the microstructure 110 may reach the reflection unit 113 of the microstructure 110 so as to be reflected, and then may be reflected on a counter electrode 243 of the OLED apparatus 200 (see FIG. 5) so as to proceed toward the optical film 100. The light A2 reflected on the counter electrode 243 may be transmitted through the second transmission unit 112, proceed toward the central portion 114, and then be reflected on the reflection unit 113. As such, light incident on the OLED apparatus 200 may be concentrated by being repeatedly reflected on the reflection unit 113 and the counter electrode 243 and then be emitted outward through the first transmission unit 111.

From among light emitted from the OLED apparatus 200, some light B1 may be emitted outward through the second transmission unit 112, the central portion 114, and the first transmission unit 111 without being reflected, other light B3 may be transmitted through the second transmission unit 112, be reflected on the reflection unit 113, and be emitted outward through the first transmission unit 111, and still other light B3 may be concentrated by being repeatedly reflected on the reflection unit 113 and the counter electrode 243 and be emitted outward through the first transmission unit 111.

As described above, the optical film 100 absorbs external light so as to prevent the external light from being reflected, and concentrates light emitted from the OLED apparatus 200 so as to emit the concentrated light outward. Accordingly, light extraction efficiency may be increased.

Figure 5:
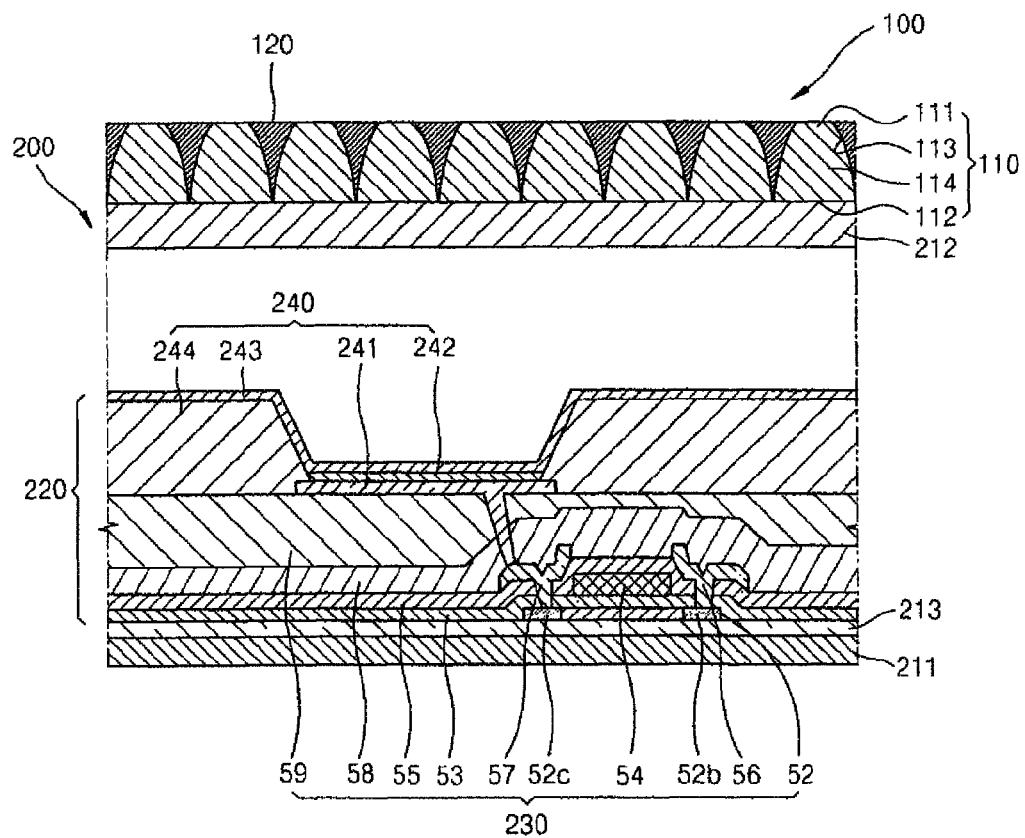
FIG. 5 is a cross-sectional view of an organic light emitting display (OLED) apparatus according to an embodiment of the present invention.

FIG. 5 is a cross-sectional view of the OLED apparatus 200 according to an embodiment of the present invention. FIG. 5 exemplarily illustrates an active matrix (AM)-type organic light emitting display apparatus. In FIG. 5, every sub-pixel has at least one thin film transistor (TFT) and an organic light emitting element as a self light emitting device. However, the TFT is not limited to the structure illustrated in FIG. 5, and the number and structure of TFTs may vary. The AM-type organic light emitting display apparatus will now be described in detail.

Referring to FIG. 5, a buffer layer 213 is formed on a substrate 211, an organic light emitting unit 220 and a second substrate 212 are formed on the buffer layer 213, and an optical film 100 are disposed on the second substrate 212.

The organic light emitting unit 220 includes a pixel circuit unit 230 and an organic light emitting element 240. The organic light emitting unit 220 is formed by sequentially forming the pixel circuit unit 230 and the organic light emitting element 240 on the buffer layer 213. The pixel circuit unit 230 may be a TFT.

An active layer 52 having a pattern is formed on the buffer layer 213 of the substrate 211. A gate insulating layer 53 is formed on the active layer 52, and a gate electrode 54 is formed on a region of the gate insulating layer 53. The gate electrode 54 is connected to a gate line (not shown) for applying a TFT on/off signal. An interlayer insulating layer 55 is formed on the gate electrode 54, and source and drain electrodes 56 and 57, respectively, are formed to contact source and drain regions 52b and 52c, respectively, of the active layer 52 through contact holes formed in the interlayer insulating layer 55 and the gate insulating layer 53. An insulating layer 58 is formed on the source and drain electrodes 56 and 57, respectively. The insulating layer 58 may be a passivation layer formed of $SiO_2$, SiNx, or the like. A planarization layer 59 may be formed on the insulating layer 58 by using an organic material such as acryl, polyimide, benzocyclobutene (BCB) or the like.

A pixel electrode 241, functioning as an anode electrode of the organic light emitting element 240, is formed on the planarization layer 59, and a pixel define layer 244 is formed by using an organic material to cover the planarization layer 59 and ends of the pixel electrode 241. An opening is formed in the pixel define layer 244, and an intermediate layer 242 is formed on the pixel electrode 241 exposed by the opening in the pixel define layer 244. Here, the intermediate layer 242 includes an emission layer (EML). One or more embodiments of the present invention are not limited to the above-described structure, and various structures of an OLED apparatus may also be applied.

The organic light emitting element 240 displays image information by emitting red (R), green (G) or blue (B) light according to the flow of a current, and includes the pixel electrode 241 connected to the drain electrode 57 of a TFT so as to obtain plus power supplied from the TFT, a counter electrode 243 covering the whole pixel so as to supply minus power, and the intermediate layer 242 disposed between the pixel electrode 241 and the counter electrode 243 so as to emit light.

The pixel electrode 241 and the counter electrode 243 are insulated from each other by the intermediate layer 242, and apply voltages of different polarities to the intermediate layer 242 so that the intermediate layer 242 emits light.

Here, an organic layer having a low-molecular or high-molecular weight may be used as the intermediate layer 242. If a low-molecular organic layer is used, the intermediate layer 242 may have a structure including at least one of the group consisting of a hole injection layer (HIL), a hole transport layer (HTL), an emission layer (EML), an electron transport layer (ETL) and an electron injection layer (EIL), and may be formed of various organic materials, such as copper phthalocyanine (CuPc), N,N'-Di(naphthalene-1-yl)-N,N'-diphenyl-benzidine (NPB), and tris-8-hydroxyquinoline aluminum (Alq3) by using, for example, a vacuum deposition method.

If the high-molecular organic layer is used, the intermediate layer 242 may have a structure including an HTL and an EML. In this case, the HTL may be formed of poly-3,4-ethylendioxythiophene (PEDOT) and the EML may be formed of a poly-phenylenevinylene (PPV)-based or poly-fluorene-based polymer material, by using, for example, a screen printing method or an inkjet printing method.

However, the structure of the intermediate layer 242 is not limited thereto and may vary.

The intermediate layer 242 may be formed by using, for example, a spin coating method. In more detail, an organic material is coated to cover the pixel electrode 241 and the pixel define layer 244. Then, a substrate 211 is rotated. As the substrate 211 is rotated, the organic material coated on the pixel define layer 244 is removed, and only the organic material coated on the pixel electrode 241 remains. Then, the organic material coated on the pixel electrode 241 may be baked so as to form the intermediate layer 242.

The pixel electrode 241 functions as an anode electrode and the counter electrode 243 functions as a cathode electrode. However, the polarities of the pixel electrode 241 and the counter electrode 243 may be switched.

The pixel electrode 241 may be a transparent electrode or a reflective electrode. If a transparent electrode is used, the pixel electrode 241 may be formed of indium tin oxide (ITO), indium zinc oxide (IZO), zinc oxide (ZnO), or indium oxide ($In_2O_3$). If a reflective electrode is used, the pixel electrode 241 may be formed by forming a reflective layer formed of silver (Ag), magnesium (Mg), aluminum (Al), platinum (Pt), palladium (Pd), gold (Au), nickel (Ni), neodymium (Nd), iridium (Ir), chromium (Cr) or an alloy thereof, and then forming on the reflective layer a transparent layer formed of ITO, IZO, ZnO, or $In_2O_3$.

Also, the counter electrode 243 may be a transparent electrode or a reflective electrode. If a transparent electrode is used, the counter electrode 243 is used as a cathode electrode, and thus may be formed by depositing metal having a low work function, e.g., lithium (Li), calcium (Ca), LiF/Ca, LiF/Al, Al, Ag, Mg or an alloy thereof, toward the intermediate layer 242, and then forming an auxiliary electrode layer or a bus electrode line on the deposited metal by using a material for forming a transparent layer, e.g., ITO, IZO, ZnO, or $In_2O_3$. If a reflective electrode is used, the counter electrode 243 may be formed by depositing Li, Ca, LiF/Ca, LiF/Al, Al, Ag, Mg or an alloy thereof on the whole surface of the pixel define layer 244 and the intermediate layer 242.

After the organic light emitting unit 220 is formed, an encapsulating unit (not shown) seals the organic light emitting unit 220. The encapsulating unit may be formed by alternately stacking organic material thin film layers and inorganic material thin film layers, or may be formed as a metallic layer.

The second substrate 212 may be formed of a material having a high transmittance so as to transmit light emitted from the organic light emitting unit 220. As described above, the optical film 100 is disposed on the second substrate 212.

As illustrated in FIG. 5, a microstructure 110 of the optical film 100 is smaller than a pixel of the organic light emitting element 240 and a plurality of microstructures 110, instead of one microstructure 110, may correspond to one pixel. Accordingly, the optical film 100 may be disposed on the second substrate 212 without an additional aligning process between the organic light emitting element 240 and the microstructures 110.

As described above, according to the one or more of the above embodiments of the present invention, external light may be prevented from being reflected and light emitted from an OLED apparatus may be concentrated before being emitted. Accordingly, light extraction efficiency may be increased.

It should be understood that the exemplary embodiments described herein should be considered in a descriptive sense only and not for purposes of limitation. Descriptions of features or aspects within each embodiment should typically be considered as available for other similar features or aspects in other embodiments.

What is claimed is:

1. An organic light emitting display (OLED) apparatus, comprising:
   a first substrate;
   an organic light emitting unit disposed on the first substrate and comprising a plurality of organic light emitting elements;
   a second substrate covering the first substrate; and
   an optical film disposed on the second substrate;
   wherein the optical film concentrates light emitted from the light emitting unit so as to emit the concentrated light outward, and absorbs external light so as to prevent the external light from being reflected.

2. The apparatus of claim 1, wherein the optical film comprises:
   a plurality of microstructures; and
   a light absorption unit disposed between the plurality of microstructures and absorbing external light;
   wherein the microstructures concentrate light emitted from the OLED apparatus so as to emit the concentrated light outward, and
   wherein the light absorption unit absorbs light incident from outside the OLED apparatus so as to prevent the incident light from being reflected.

3. The apparatus of claim 2, wherein each of the plurality of microstructures comprises:
   a first transmission unit disposed on a first surface of the optical film, and facing outward;

a second transmission unit disposed on a second surface of the optical film, which is opposite to the first surface; and a reflection unit connecting the first transmission unit and the second transmission unit and forming a side wall of each of the plurality of microstructures;

wherein an area of the first transmission unit is smaller than an area of the second transmission unit.

4. The apparatus of claim 3, wherein each of the first transmission unit and the second transmission unit transmits light.

5. The apparatus of claim 3, wherein each of the first surface and the second surface is a smooth surface.

6. The apparatus of claim 3, wherein the reflection unit reflects light transmitted through one of the first transmission unit and the second transmission unit and proceeding toward the reflection unit.

7. The apparatus of claim 3, wherein the reflection unit is convex toward the first surface.

8. The apparatus of claim 2, wherein internal portions of the plurality of microstructures are formed of a transparent resin material.

9. The apparatus of claim 8, wherein a refractive index of the resin material continuously changes in a direction from the first surface toward the second surface.

10. The apparatus of claim 9, wherein the refractive index of the resin material is increased in a direction from the first surface toward the second surface.

11. The apparatus of claim 1, wherein a refractive index of the plurality of microstructures is greater than that of the light absorption unit.

12. The apparatus of claim 1, wherein one organic light emitting element corresponds to a plurality of microstructures.

13. The apparatus of claim 1, wherein a distance between the plurality of microstructures is greater than a distance between the plurality of organic light emitting elements.

14. The apparatus of claim 13, wherein the distance between the plurality of microstructures is in a range of about 200 nm to 250 nm.

* * * * *